(12) United States Patent
Padmanabhan et al.

(10) Patent No.: US 7,633,131 B1
(45) Date of Patent: Dec. 15, 2009

(54) MEMS SEMICONDUCTOR SENSOR DEVICE

(75) Inventors: Gobi R. Padmanabhan, Sunnyvale, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 310 days.

(21) Appl. No.: 11/701,002

(22) Filed: Feb. 1, 2007

Related U.S. Application Data

(62) Division of application No. 10/894,528, filed on Jul. 20, 2004, now Pat. No. 7,192,819.

(51) Int. Cl.
*H01L 27/14* (2006.01)
*H01L 29/82* (2006.01)
*H01L 29/84* (2006.01)

(52) U.S. Cl. ............... 257/414; 257/288; 257/352; 257/E21.58; 257/E21.127; 257/E21.154; 257/E21.351

(58) Field of Classification Search ........... 257/414, 257/277, 285, 287, 288, 352, 427
See application file for complete search history.

(56) References Cited

U.S. PATENT DOCUMENTS

| | | | | |
|---|---|---|---|---|
| 4,790,192 A | * | 12/1988 | Knecht et al. | 73/721 |
| 5,702,619 A | * | 12/1997 | Kurtz et al. | 216/2 |
| 6,084,257 A | * | 7/2000 | Petersen et al. | 257/254 |
| 6,279,402 B1 | | 8/2001 | Fisher | 73/754 |
| 6,316,796 B1 | * | 11/2001 | Petersen et al. | 257/254 |
| 6,378,378 B1 | | 4/2002 | Fisher | 73/754 |
| 7,192,819 B1 | * | 3/2007 | Padmanabhan et al. | 438/197 |

OTHER PUBLICATIONS

Karl Behringer, University of Washington, "EE 539 Tm/M(S)E 599 Tm, Lecture B2, Micro/Nano/MEMS", Spring 2003, [online], [retrieved on Jun. 28, 2004]. Retrieved from the Internet: <URL:http://courses.washington.edu/mengr599/tm_taya/notes/b2.pdf>. pp. 1-10 (unnumbered).

* cited by examiner

*Primary Examiner*—David Nhu
(74) *Attorney, Agent, or Firm*—Mark C. Pickering

(57) ABSTRACT

A semiconductor sensor device is formed using MEMS technology by placing a thin layer of single-crystal silicon, which includes semiconductor devices, over a cavity, which has been formed in a semiconductor material. The thin layer of single-crystal silicon can be formed by forming the semiconductor devices in the top surface of a single-crystal silicon wafer, thinning the silicon wafer to a desired thickness, and then dicing the thinned wafer to form silicon layers of a desired size. The MEMS device can be used to implement a pressure sensor, microphone, temperature sensor, and a joystick.

19 Claims, 8 Drawing Sheets

MEMS SEMICONDUCTOR SENSOR DEVICE

This is a divisional application of application Ser. No. 10/894,528 filed on Jul. 20, 2004 now U.S. Pat. No. 7,192,819.

BACKGROUND OF THE INVENTION

1. Field of the Invention

The present invention relates to a semiconductor sensor devices and, more particularly, to a method of forming a semiconductor sensor device using MEMS technology.

2. Description of the Related Art

A micro-electromechanical system (MEMS) is a microscopic machine that is fabricated using the same types of steps (e.g., the deposition of layers of material and the selective removal of the layers of material) that are used to fabricate conventional analog and digital CMOS circuits.

One type of MEMS is a pressure sensor. Pressure sensors commonly use a diaphragm, and measure pressure by measuring changes in the deformation of the diaphragm. The deformation of the diaphragm, in turn, can be detected by changes in the capacitance or piezoresistance of the diaphragm.

FIGS. 1A-1B show views that illustrate a prior-art, piezoresistive MEMS pressure sensor 100. FIG. 1A shows a plan view, while FIG. 1B shows a cross-sectional view taken along line 1B-1B of FIG. 1A. As shown in FIGS. 1A-1B, MEMS pressure sensor 100 includes a p-base 110 and a p-diaphragm 112 that is supported by base 110.

In addition, MEMS pressure sensor 100 also includes four piezoresistors R1, R2, R3, and R4 that are formed in diaphragm 112 and electrically connected together. For example, the piezoresistors R1, R2, R3, and R4 can be implemented with n+ doped regions, which are each aligned with the <110> crystal orientation.

As further shown in FIGS. 1A-1B, the piezoresistors R1, R2, R3, and R4 are connected in a Wheatstone Bridge configuration where a sense voltage VS is placed between the node located between resistors R2 and R3, and the node located between resistors R1 and R4. Further, an output voltage VO is taken between the node located between resistors R1 and R2, and the node located between resistors R3 and R4.

In operation, when the pressure changes, the change in pressure changes the strain placed on the piezoresistors R1, R2, R3, and R4. The change in strain deforms the band gap structures of the piezoresistors R1, R2, R3, and R4. The deformed band gap structures change the mobility and density of the charge carriers which, in turn, changes the resistivity. The changes in resistivity are detected by the Wheatstone Bridge, which varies the output voltage VO in response to the changes in resistivity.

MEMS pressure sensor 100 is typically quite complex to fabricate. For example, MEMS pressure sensor 100 can be fabricated by forming the diaphragm over a sacrificial material, and then etching away the sacrificial material to expose the diaphragm. Alternately, the diaphragm can be exposed by etching in from the backside.

Thus, although there are a number of ways of fabricating MEMS pressure sensors, there is a need for a less expensive approach to the fabrication of a MEMS pressure sensor.

BRIEF DESCRIPTION OF THE DRAWINGS

FIG. 1A is a plan view, while FIG. 1B is a cross-sectional view taken along line 1B-1B of FIG. 1A.

FIGS. 2A-8A are a series of plan views illustrating an example of a method of forming a semiconductor device 200 in accordance with the present invention. FIGS. 2B-8B are a series of cross-sectional views corresponding with the plan views of FIGS. 2A-8A in accordance with the present invention.

DETAILED DESCRIPTION OF THE INVENTION

FIGS. 2A-8A show a series of plan views that illustrate an example of a method of forming a semiconductor device 200 in accordance with the present invention. FIGS. 2B-8B show a series of cross-sectional views that correspond with the plan views of FIGS. 2A-8A in accordance with the present invention.

As described in greater detail below, the method of the present invention places a thin layer of single-crystal silicon over a cavity to form the diaphragm of a MEMS device. The thin layer of single-crystal silicon, which can be formed by thinning and dicing a single-crystal silicon wafer, can be used to realize a number of MEMS devices, including a pressure sensor, a microphone, a temperature sensor, and a joystick.

Figure 1A:
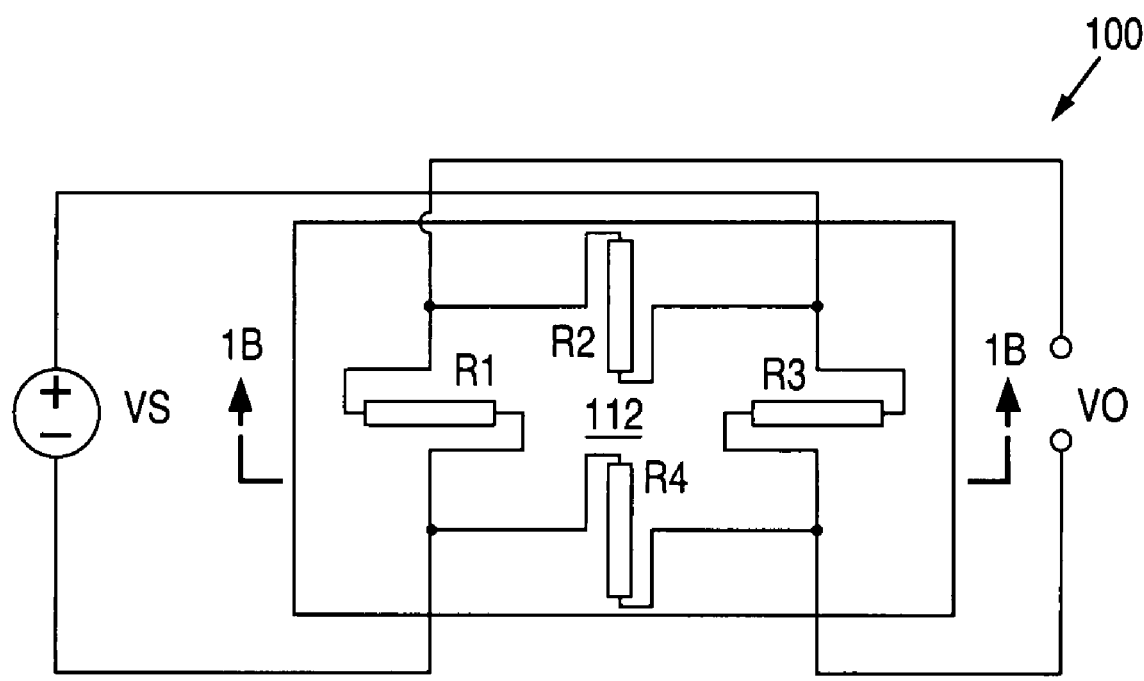
FIGS. 1A-1B are views illustrating a prior-art, piezoresistive MEMS pressure sensor 100.
Figure 1B:
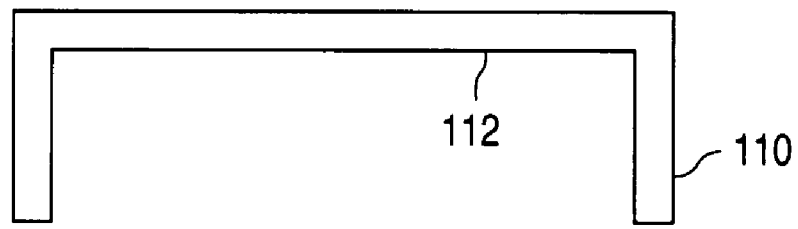
Figure 2A:
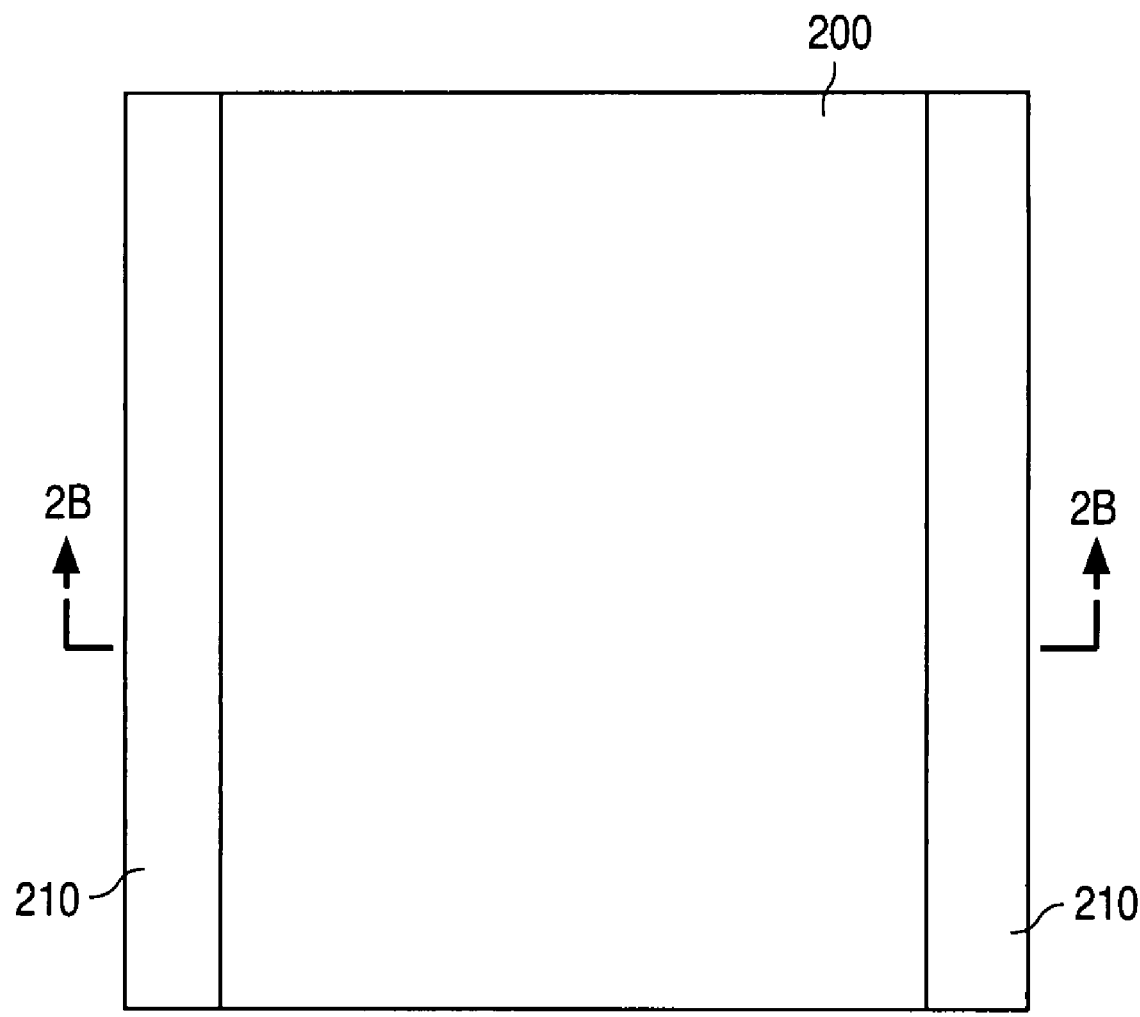
Figure 2B:
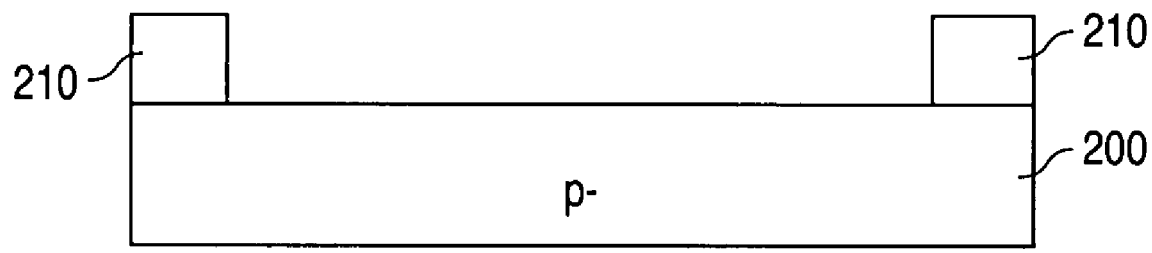
Figure 3A:
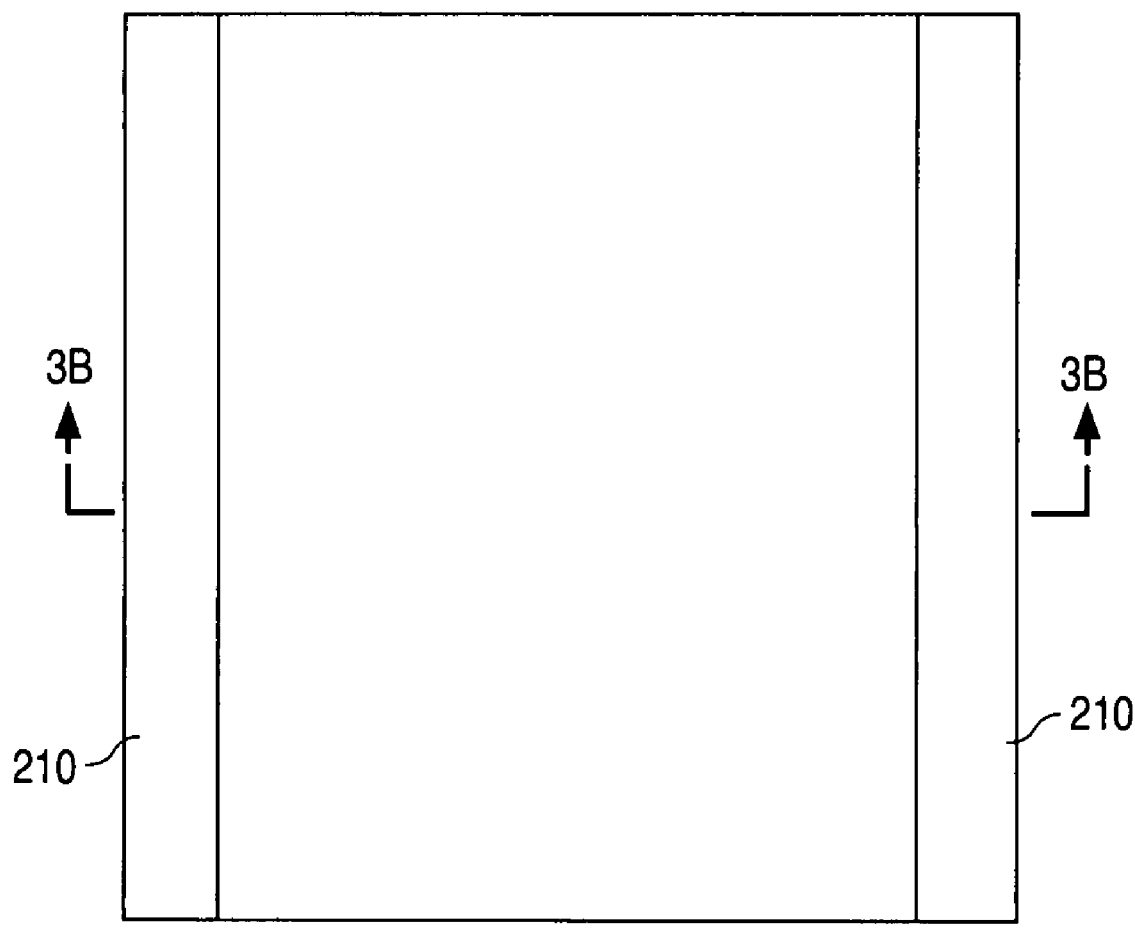
Figure 3B:
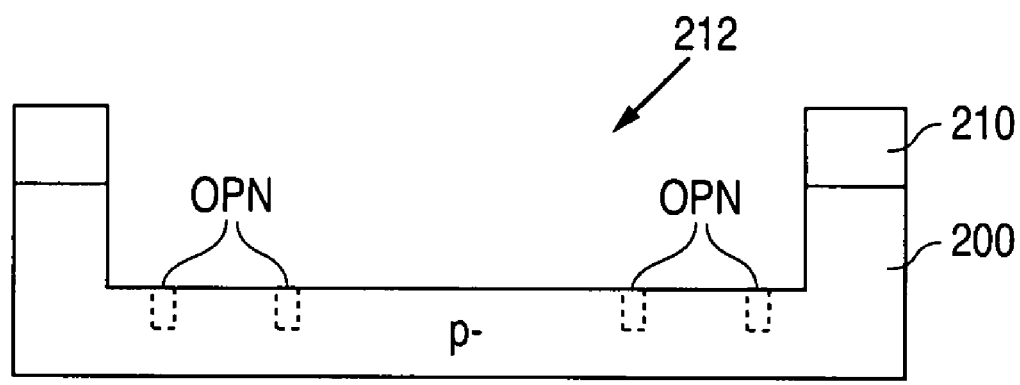

As shown in FIGS. 2A and 2B, the method, which utilizes a conventionally-formed, p-single-crystal silicon semiconductor wafer 200, begins by forming a mask 210 on the top surface of wafer 200. Following this, as shown in FIGS. 3A-3B, the exposed regions of semiconductor wafer 200 are etched for a predetermined period of time to form a cavity 212.

In addition, a number of openings OPN can optionally be formed in the bottom of cavity 212 using conventional steps. These openings can then become through-the-wafer openings after a subsequent backside planarization step, which can be advantageous in a microphone application. After the etch, mask 210 is removed.

Figure 4A:
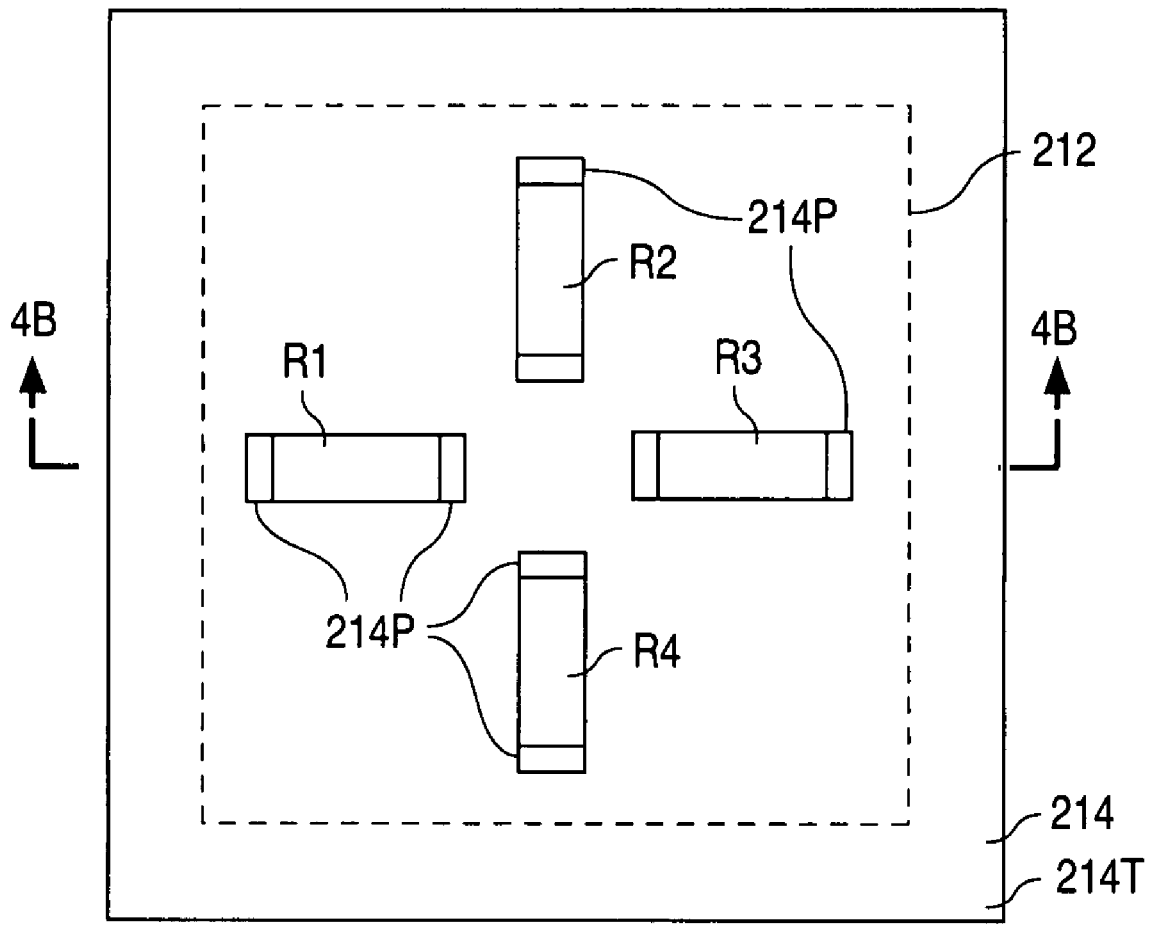
Figure 4B:
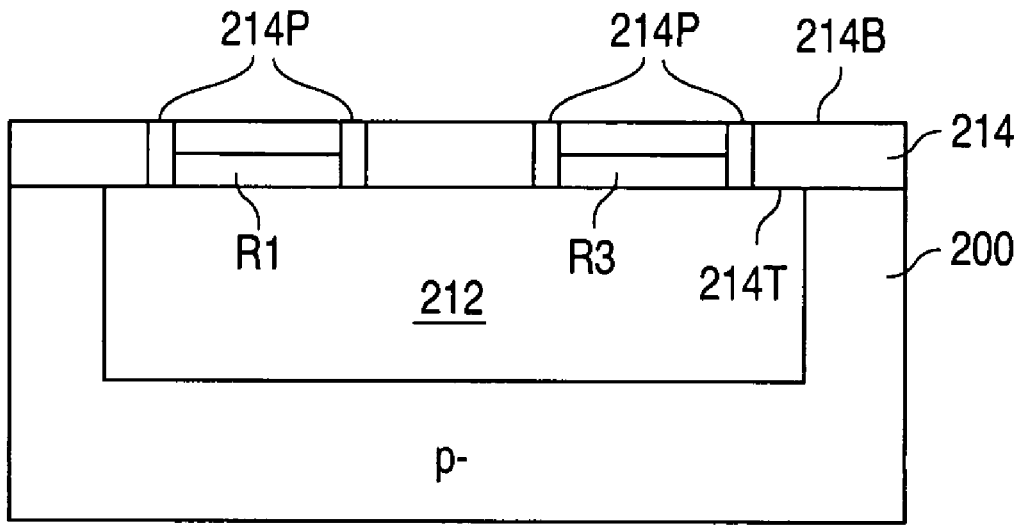

Next, as shown in FIGS. 4A-4B, a thin layer of p-single-crystal silicon 214 approximately $25.4-127\times10^{-6}$ m (1-5 mils) thick is connected to semiconductor wafer 200 to cover cavity 212 and form a diaphragm. Silicon layer 214, which includes a number of semiconductor devices which respond differently when the diaphragm is flexed, can be connected to wafer 200 in any of a number of conventional ways, such as with wafer bonding or a glue type material.

Silicon layer 214 has a top surface 214T and a bottom surface 214B. In one embodiment, the top surface 214T contacts the top surface of wafer 200 when silicon layer 214 is connected to wafer 200 to cover cavity 212. In this embodiment, the semiconductor devices formed on silicon layer 214 are protected by cavity 212. Alternately, the bottom surface 214B can contact the top surface of wafer 200 when silicon layer 214 is connected to wafer 200 to cover cavity 212.

Silicon layer 214 can be fabricated by first forming the semiconductor devices in a p-single-crystal silicon wafer, and then thinning the wafer using conventional backside chemical-mechanical polishing (CMP) steps to reach the desired thickness. After this, the thinned wafer is diced to form a large number of silicon layers 214 of the desired size.

The semiconductor devices, such as piezoresistors, capacitors, and transistors, are formed in the silicon layers 214 using conventional steps. For example, as shown in the FIGS. 4A and 4B, four piezoresistors R1-R4 can be formed in each of the silicon layers 214 as heavily-doped surface regions by masking and implanting the wafer that forms silicon layer 214.

In addition, conductive plugs 214P can be formed in the wafer, for example, at the ends of the piezoresistors R1-R4. When the wafer is subsequently thinned, the conductive plugs 214P extend completely through silicon layer 214, thereby providing for a connection to the semiconductor devices (e.g., the piezoresistors R1-R4) when the top surface 214T is connected to the top surface of wafer 200.

Figure 5A:
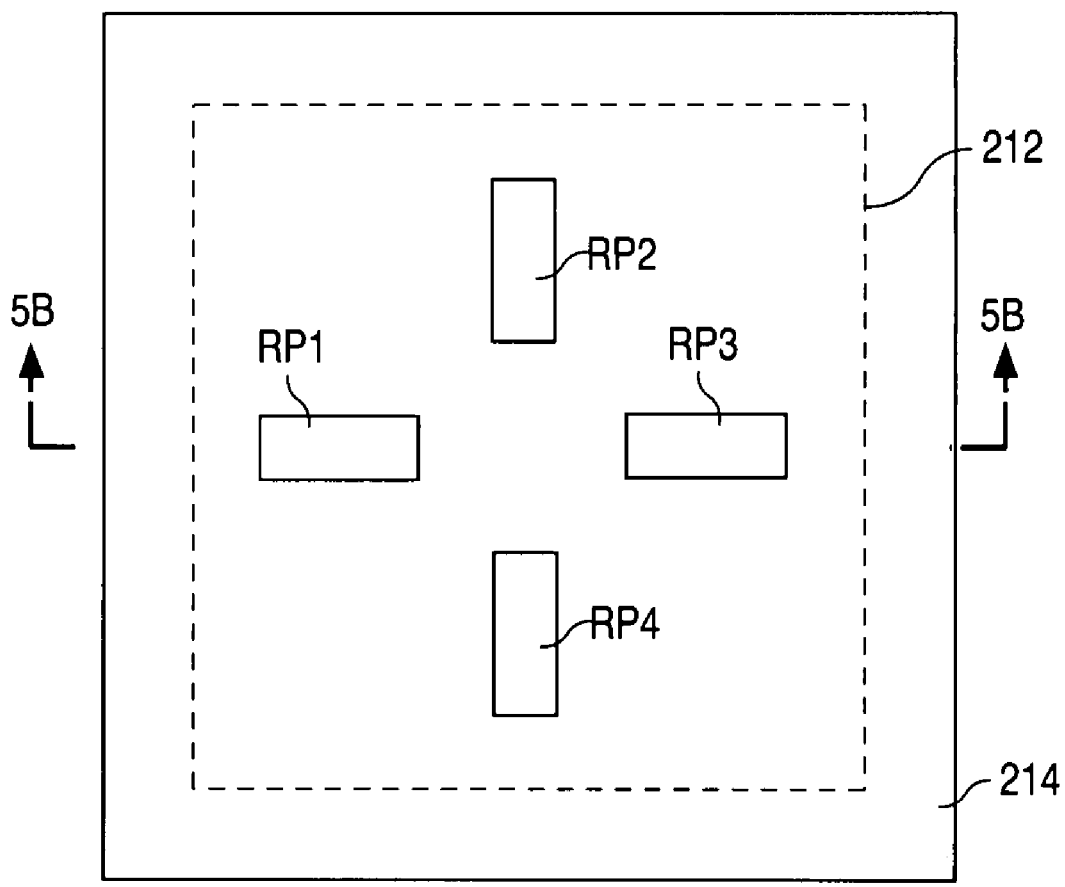
Figure 5B:
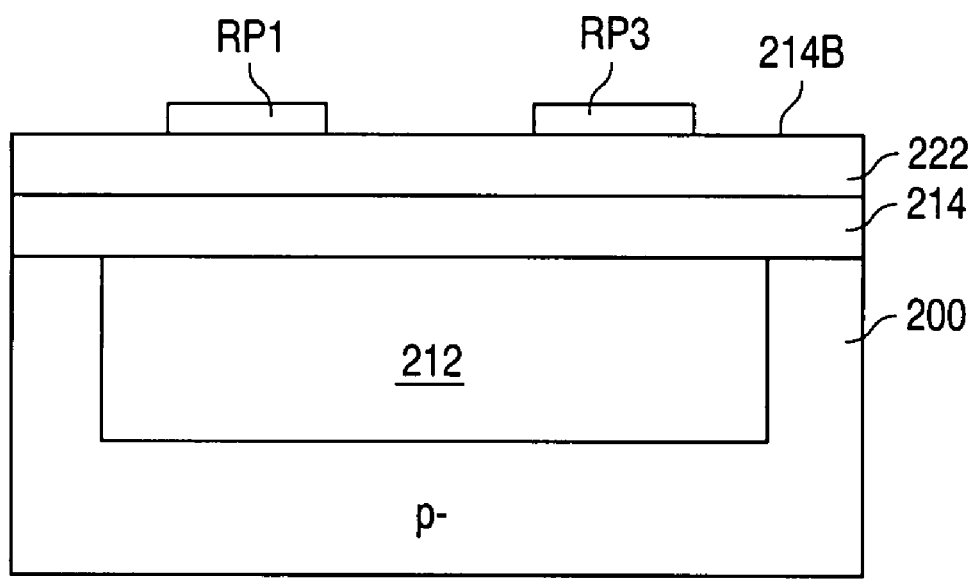

The piezoresistors R1-R4 can also be implemented as doped polysilicon strips formed on an isolator which, in turn, is formed on silicon layer 214. For example, as shown in FIGS. 5A-5B, a layer of flexible insulation material 222, such as oxide, can be formed on the wafer that forms silicon layer 214, followed by the formation of four polysilicon resistors RP1, RP2, RP3, and RP4. (The polysilicon resistors, which are piezoresistive, can be formed by depositing a polysilicon layer, doping the polysilicon layer, and then masking and etching the polysilicon layer to form the resistors.)

Figure 6A:
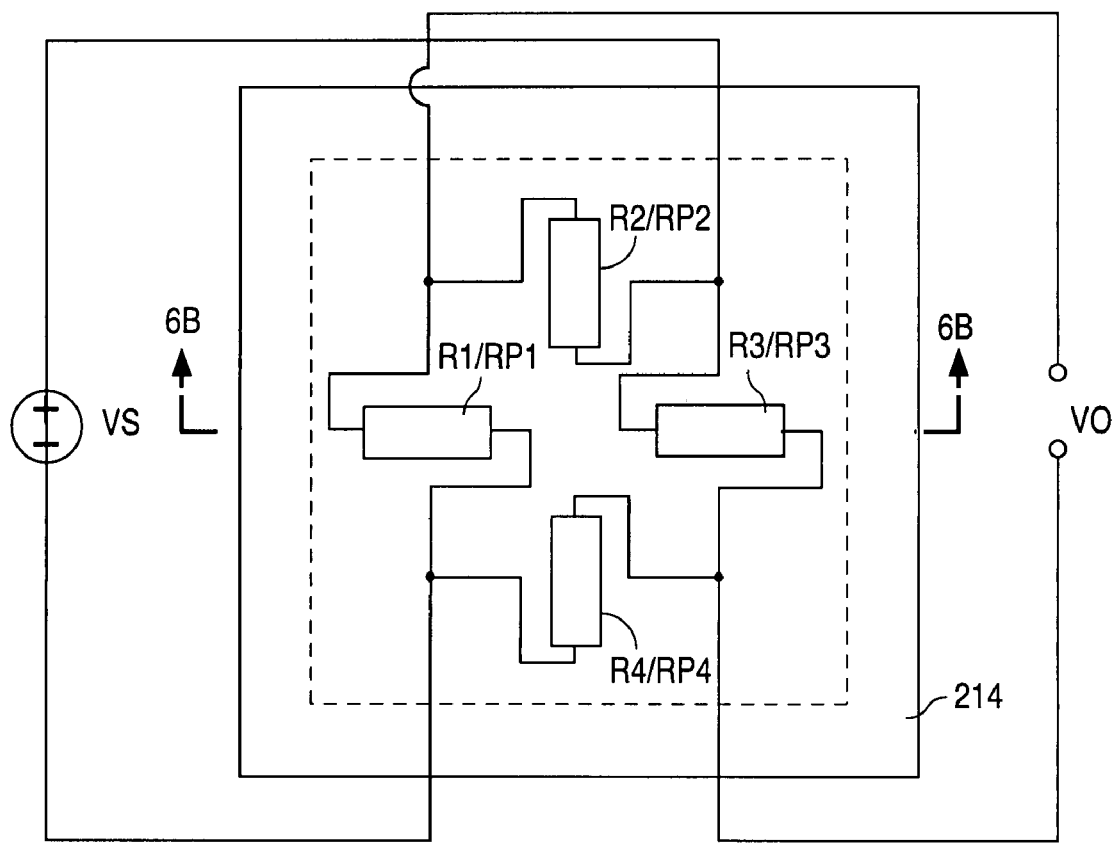
Figure 6B:
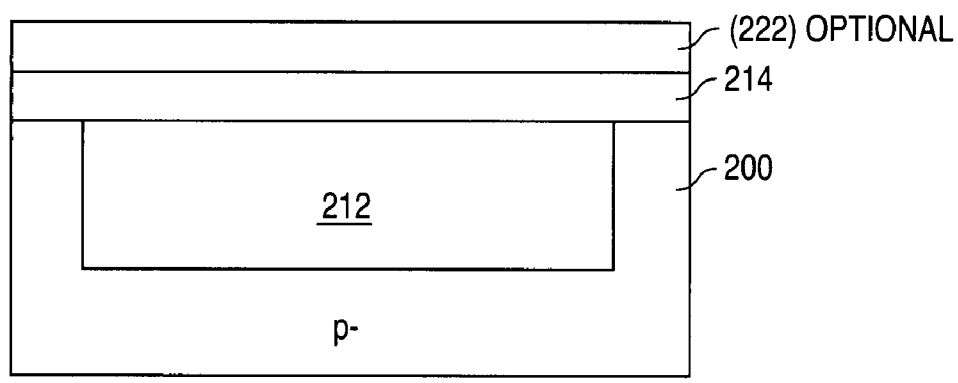

As shown in FIGS. 6A-6B, the piezoresistors R1, R2, R3, and R4 (or RP1, RP2, RP3, and RP4) can be further electrically connected in a Wheatstone Bridge configuration where a sense voltage VS is placed between the node located between resistors R2 and R3 (or RP2 and RP3), and the node located between resistors R1 and R4 (or RP1 and RP4). Further, an output voltage VO is taken between the node located between resistors R1 and R2 (or RP1 and RP2), and the node located between resistors R3 and R4 (or RP3 and RP4).

In operation, the structures shown in FIGS. 4A-4B and 5A-5B can be used to realize a piezoresistive MEMS pressure sensor. When used as a pressure sensor, the diaphragm, i.e., silicon layer 214 and piezoresistors R1, R2, R3, and R4 (or silicon layer 214, insulation layer 222, and the piezoresistors RP1, RP2, RP3, and RP4), flexes in response to changes in pressure.

The distortion in shape caused by the flexing deforms the band gap structures of the piezoresistors R1, R2, R3, and R4 (and RP1, RP2, RP3, and RP4) which, in turn, changes the resistivity. The changes in resistivity are detected by the Wheatstone Bridge which varies the output voltage VO in response. The variation in the output voltage VO is detected over time and used to represent pressure changes.

On the other hand, when capacitors are used in lieu of, or in addition to, the piezoresistors R1-R4, the capacitances of the capacitors vary as the diaphragm flexes. The variation in capacitance is detected over time and used to represent pressure changes. When transistors are used in lieu of, or in addition to, the piezoresistors R1-R4, the transistors incorporate both resistance and capacitance aspects.

In addition to pressure sensors, the present invention can also be used to realize a microphone, which is a sensitive pressure sensor that responds to small pressure (e.g., sound) vibrations (openings OPN can be used with the microphone). Further, the present invention can also be used to realize a temperature sensor. The resistances of the piezoresistors R1, R2, R3, and R4 (and RP1, RP2, RP3, and RP4) are highly dependent on temperature. As a result, changes in temperature lead to changes in resistance which, in turn, can be detected by the Wheatstone Bridge, which varies the output voltage VO in response to the changes in the resistance.

Figure 7A:
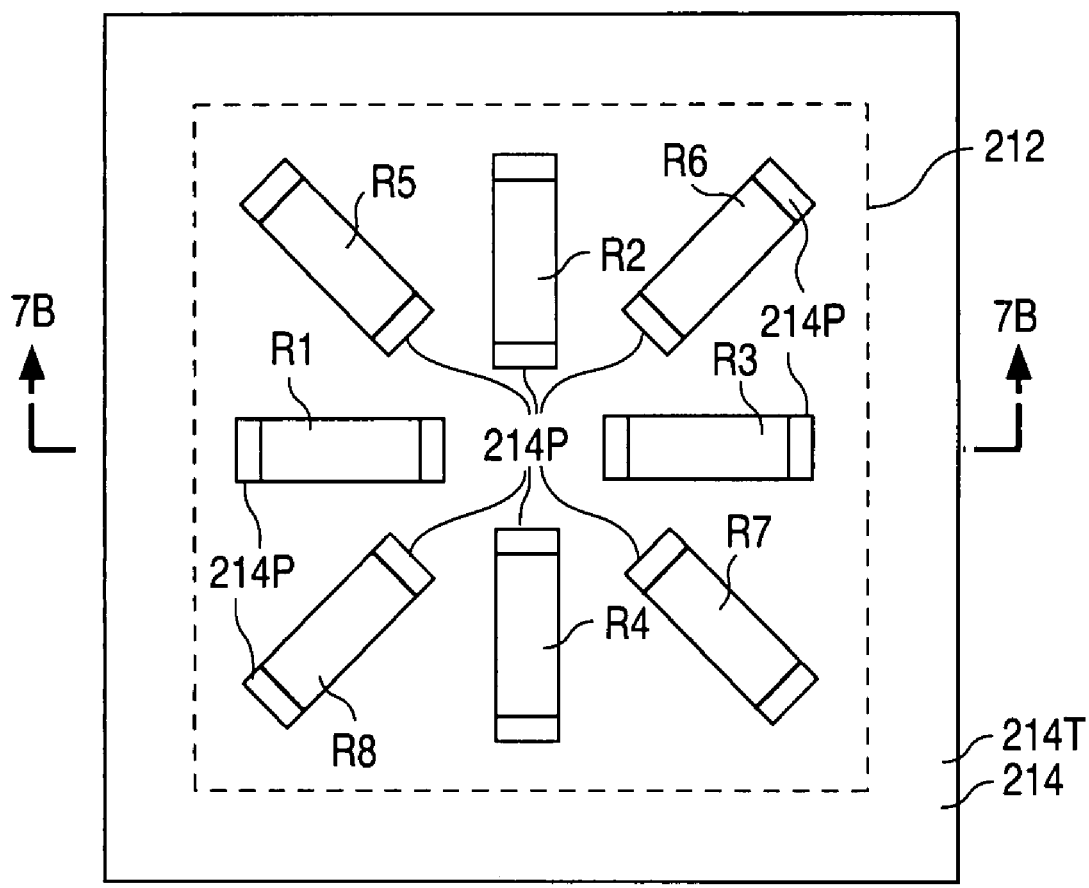
Figure 7B:
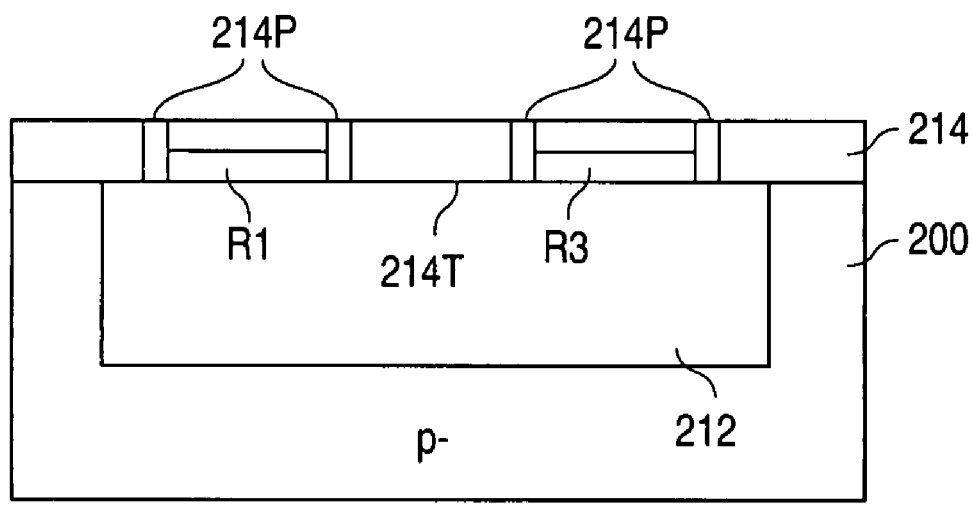

In an alternate embodiment, as shown in FIGS. 7A-7B, eight piezoresistors R1-R8 (or RP1-RP8) are utilized in lieu of four. In this configuration, piezoresistors R1-R4 are identical to piezoresistors R1-R4 of FIGS. 4A-4B, and can be connected to a Wheatstone Bridge as shown in FIGS. 6A-6B. Further, piezoresistors R5-R8, which are formed at the same time that piezoresistors R1-R4 are formed, can also be connected to another Wheatstone Bridge in a similar manner. The outputs of the two Wheatstone Bridges can then be used to provide a more sensitive measure of the deformation of the diaphragm.

Figure 8A:
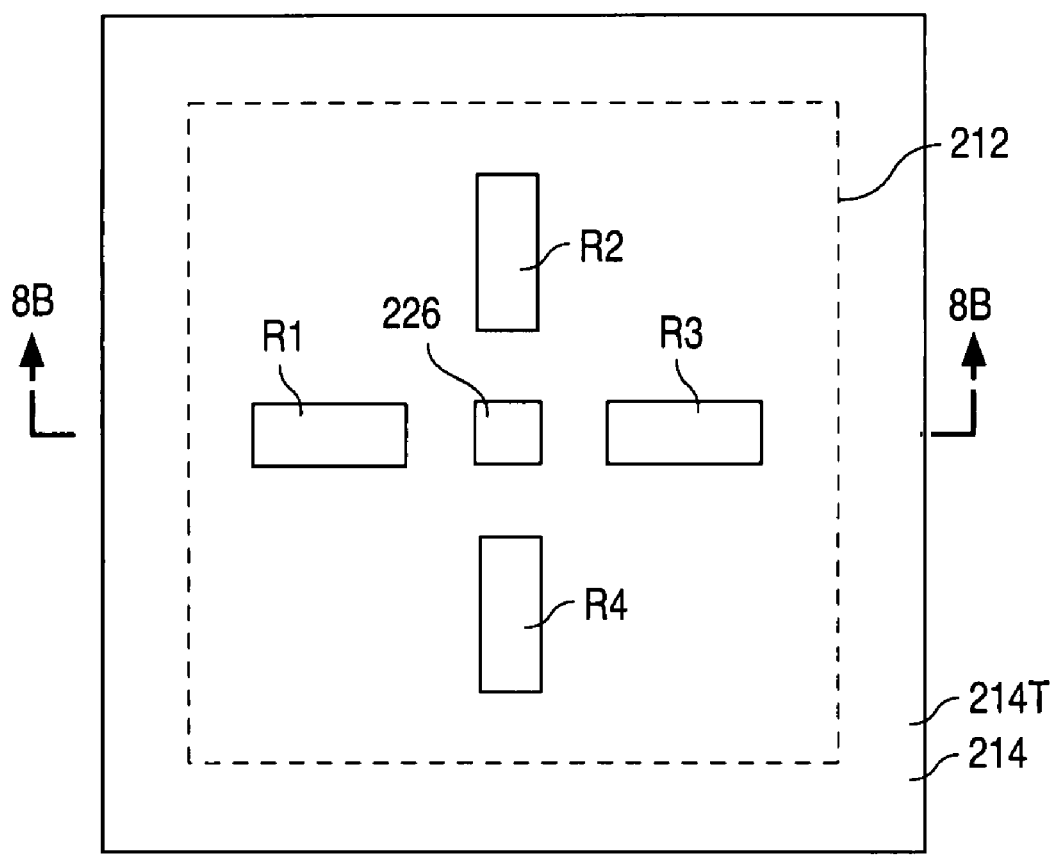
Figure 8B:
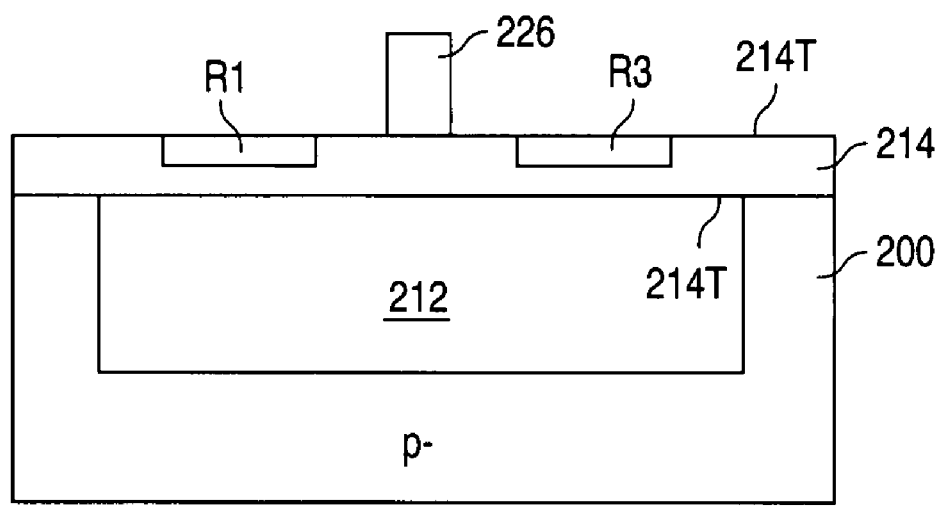

In another embodiment, as shown in FIGS. 8A-8B, after the piezoresistors R1-R4 (or R1-R8) have been formed, a single-crystal silicon pillar 226, which has a top end, a bottom end, and a length that extends from the top end to the bottom end, is connected to silicon layer 214. Pillar 226 is connected to silicon layer 214 so that the bottom end contacts a contact region on the top surface 214T of silicon layer 214. Silicon pillar 226 can be connected to silicon layer 214 in any of a number of conventional ways, such as with wafer bonding or a glue type material.

In operation, the structure shown in FIGS. 8A-8B can be used as a joystick. When used as a joystick, silicon layer 214 flexes when silicon pillar 226 is pushed in different directions. The distortion in shape caused by the flexing changes the resistance which, in turn, causes the Wheatstone Bridge to vary the output voltage VO. The variation in the output voltage VO is detected and used to represent directional commands entered by the joystick user.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor sensor comprising:
a first region of semiconductor material having a bottom surface and a top surface, the top surface of the first region of semiconductor material having an opening, the opening having a bottom surface that lies below the top surface of the first region of semiconductor material; and
a second region of semiconductor material attached to the top surface of the first region of semiconductor material to lie over the opening, the second region of semiconductor material having a top surface and a bottom surface, the second region of semiconductor material including a number of semiconductor devices that touch the top surface of the second region of semiconductor material.

2. The semiconductor sensor of claim 1 wherein the number of semiconductor devices include devices from a list of resistors, capacitors, and transistors.

3. The semiconductor sensor of claim 2 wherein the top surface of the second region of semiconductor material contacts touches the top surface of the first region of semiconductor material.

4. The semiconductor sensor of claim 2 wherein the second region of semiconductor material is wafer bonded to the first region of semiconductor material.

5. The semiconductor sensor of claim 2 wherein the second region of semiconductor material is attached to the first region of semiconductor material via an adhesive material.

6. The semiconductor sensor of claim 1 wherein the second region of semiconductor material seals the opening.

7. The semiconductor sensor of claim 1 wherein the first region of semiconductor material has a number of holes that each extend from the bottom surface of the opening to the bottom surface of the first region of semiconductor material.

8. The semiconductor sensor of claim 1 wherein the bottom surface of the opening is spaced apart from the bottom surface of the first region of semiconductor material.

9. The semiconductor sensor of claim 1 wherein the second region of semiconductor material is single-crystal semiconductor material.

10. A semiconductor sensor comprising:
a first region of single-crystal semiconductor material having a bottom surface, a top surface, and a cavity formed in the top surface of the first region of semiconductor material, the cavity having a bottom surface;
a second region of single-crystal semiconductor material attached to the top surface of the first region of single-crystal semiconductor material to lie over the cavity, the second region of single-crystal semiconductor material having a top surface and a bottom surface, the second region of single-crystal semiconductor material including a number of semiconductor devices formed in the top surface of the second region of single-crystal semiconductor material, the number of semiconductor devices including devices from a list of resistors, capacitors, and transistors; and
a pillar that contacts the second region of single-crystal semiconductor material, the pillar having a top end, a bottom end, and a length that extends from the top end to the bottom end, the bottom end of the pillar contacting a contact region on the top surface of the second region of single-crystal semiconductor material.

11. The semiconductor sensor of claim 10 wherein the top surface of the second region of single-crystal semiconductor material contacts the top surface of the first region of single-crystal semiconductor material.

12. A semiconductor sensor comprising:
a first region of single-crystal semiconductor material having a bottom surface, a top surface, and a cavity formed in the top surface of the first region of semiconductor material, the cavity having a bottom surface;
a second region of single-crystal semiconductor material attached to the top surface of the first region of single-crystal semiconductor material to lie over the cavity, the second region of single-crystal semiconductor material having a top surface and a bottom surface; and
a number of doped regions formed in the top surface of the second region of single-crystal semiconductor material, the doped regions having dopant concentrations that are substantially greater than a dopant concentration of the second region of single-crystal semiconductor material.

13. The semiconductor sensor of claim 12 wherein the top surface of the second region of single-crystal semiconductor material contacts the top surface of the first region of single-crystal semiconductor material.

14. The semiconductor sensor of claim 12 wherein the first region of semiconductor material has a number of openings that each extend from the bottom surface of the cavity to the bottom surface of the first region of single-crystal semiconductor material.

15. A semiconductor sensor comprising:
a first region of semiconductor material having a bottom surface and a top surface, the top surface of the first region of semiconductor material having an opening, the opening having a bottom surface that lies below the top surface of the first region of semiconductor material;
a second region of semiconductor material attached to the top surface of the first region of semiconductor material to lie over the opening, the second region of semiconductor material having a top surface and a bottom surface;
a layer of insulation material that touches the top surface of the second region of semiconductor material; and
a number of conductive regions that touch the layer of insulation material.

16. The semiconductor sensor of claim 15 wherein the first region of semiconductor material has a number of holes that each extend from the bottom surface of the opening to the bottom surface of the first region of semiconductor material.

17. The semiconductor sensor of claim 15 wherein the second region of semiconductor material is single-crystal semiconductor material.

18. The semiconductor sensor of claim 1 wherein all of the bottom surface of the second region of semiconductor material is substantially planar.

19. A semiconductor sensor comprising:
a first region of semiconductor material having a bottom surface, a top surface, and a cavity formed in the top surface of the first region of semiconductor material, the cavity having a bottom surface;
a second region of semiconductor material attached to the top surface of the first region of semiconductor material to lie over the cavity, the second region of semiconductor material having a top surface and a bottom surface, the second region of semiconductor material including a number of semiconductor devices that touch the top surface of the second region of semiconductor material; and
a pillar that contacts the second region of semiconductor material, the pillar having a top end, a bottom end, and a length that extends from the top end to the bottom end, the bottom end of the pillar contacting a contact region on the top surface of the second region of semiconductor material.

* * * * *

UNITED STATES PATENT AND TRADEMARK OFFICE
CERTIFICATE OF CORRECTION

| | | |
|---|---|---|
| PATENT NO. | : 7,633,131 B1 | Page 1 of 1 |
| APPLICATION NO. | : 11/701002 | |
| DATED | : December 15, 2009 | |
| INVENTOR(S) | : Padmanabhan et al. | |

It is certified that error appears in the above-identified patent and that said Letters Patent is hereby corrected as shown below:

Col. 4 lines 46-47 Claim 3, delete "contacts".

Signed and Sealed this

Sixteenth Day of February, 2010

David J. Kappos
*Director of the United States Patent and Trademark Office*